United States Patent [19]

Jacobsen et al.

[11] Patent Number: 5,106,455
[45] Date of Patent: Apr. 21, 1992

[54] METHOD AND APPARATUS FOR FABRICATION OF MICRO-STRUCTURES USING NON-PLANAR, EXPOSURE BEAM LITHOGRAPHY

[75] Inventors: Stephen C. Jacobsen; David L. Wells, both of Salt Lake City; Clark Davis, Holladay; John E. Wood, Salt Lake City, all of Utah

[73] Assignee: Sarcos Group, Salt Lake City, Utah

[21] Appl. No.: 647,659

[22] Filed: Jan. 28, 1991

[51] Int. Cl.$^5$ ............ B44C 1/22; C23F 1/02; C03C 15/00; B05D 3/06
[52] U.S. Cl. ............ 156/659.1; 156/654; 156/345; 219/121.35; 219/121.85; 427/43.1; 427/53.1; 430/296; 430/323; 430/324; 430/329
[58] Field of Search ............ 427/43.1, 53.1; 156/654, 655, 656, 657, 659.1, 664, 663, 665, 666, 345; 430/296, 323, 324, 329; 219/121.12, 121.21, 121.35, 121.6, 121.85, 121.86; 355/229, 233-235, 67; 101/470, 471

[56] References Cited

U.S. PATENT DOCUMENTS

| | | | |
|---|---|---|---|
| 3,770,936 | 11/1973 | Rively et al. | 219/121.6 |
| 4,940,508 | 7/1990 | Shamouilian et al. | 156/643 |
| 4,944,826 | 7/1990 | Zollman et al. | 156/345 |
| 4,959,275 | 9/1990 | Iguchi et al. | 428/603 |
| 4,964,940 | 10/1990 | Auvert et al. | 156/345 |

Primary Examiner—William A. Powell
Attorney, Agent, or Firm—Thorpe North & Western

[57] ABSTRACT

Apparatus for non-planar treatment of a workpiece utilizing exposure beam lithography includes a vacuum chamber, an exposure beam generator such as an electron beam generator disposed in the chamber for directing a beam towards a work location, a chuck disposed in the chamber for holding and positioning the workpiece at the work location, a rotary motorized stage disposed in the chamber and responsive to first control signals for selectively rotating the chuck, and thus the workpiece, to thereby expose different areas of the workpiece to the beam, and a linear motorized stage disposed in the chamber on which the rotary stage is mounted, said linear motor being responsive to second control signals for selectively moving the rotary stage and thus the chuck and workpiece in a linear direction which is generally parallel with the axis of rotation of the rotary stage. The workpiece is thus exposed over additional areas by operation of the linear stage. A controller supplies first and second control signals to the rotary stage and linear stage respectively to selectively effect the operation thereof.

22 Claims, 1 Drawing Sheet

METHOD AND APPARATUS FOR FABRICATION OF MICRO-STRUCTURES USING NON-PLANAR, EXPOSURE BEAM LITHOGRAPHY

BACKGROUND OF THE INVENTION

This invention relates to a system for fabricating micro-structures utilizing exposure beam lithography over non-planar surfaces of the micro-structures.

Lithographic techniques have been utilized for some time in the manufacture especially of integrated circuit boards and related products. The products manufactured, of course, have typically included planar surface areas to which the lithographic techniques were applied. Such techniques have proven extremely effective in the precise manufacturing and formation of very small details in the product. However, attempts to apply such techniques to other than planar surfaces have proven difficult, if not unachievable, to the present time.

With the development of very small (termed "micro") mechanical devices and elements, such as screws, pins, cutters, sensors and actuators, motors, and medical devices, to name a few, the ability to fabricate detailed features of such devices and elements in an efficient and precise way is greatly desired.

SUMMARY OF THE INVENTION

It is an object of the invention to provide a method and apparatus for fabricating micro-structures utilizing lithographic techniques.

It is also an object of the invention to provide such a method and apparatus which allows the fabrication of fine details over non-planar surface areas of a workpiece.

It is a further object of the invention to provide such a method and apparatus in which precise control of the fabrication process may be effectuated.

It is still another object of the invention to provide such a method and apparatus in which a workpiece may be moved in several degrees of freedom of movement relative to an exposure beam, in a precise and efficient manner.

The above and other objects of the invention are realized in a specific illustrative embodiment of apparatus which includes a chamber, a beam generator disposed in the chamber for producing and directing an exposure beam towards a work location, a chuck disposed in the chamber for holding and positioning a workpiece at the work location, and a first element, to which the chuck is attached, responsive to first control signals for selectively moving the chuck, and thus the workpiece, in a first degree of freedom of movement, to thereby expose different areas of the workpiece to the beam. Also included are a second element, to which the first element is attached, responsive to second control signals for selectively moving the first element, and thus the chuck and workpiece, in a second degree of freedom of movement to thereby expose still other areas of the workpiece to the beam, and a controller for developing and supplying the first control signals to the first element and the second control signals to the second element.

Advantageously, the chamber is a vacuum chamber and the exposure beam is an electron beam. With this apparatus, the workpiece may be covered with an electron beam resist, and the resist set by applying heat thereto. The workpiece would then be placed in the chuck and the beam directed toward the workpiece as the workpiece was moved in some predetermined manner by the first and second elements to thereby expose to the electron beam a pattern in the resist. After developing the exposed resist, a desired pattern could then be etched in the workpiece by applying an appropriate etchant. In this manner, a non-planar pattern could be formed in the workpiece in a precise and efficient manner.

BRIEF DESCRIPTION OF THE DRAWINGS

The above and other objects, features and advantages of the invention will become apparent from a consideration of the following detailed description presented in connection with the accompanying drawings in which.

DETAILED DESCRIPTION

Figure 1:
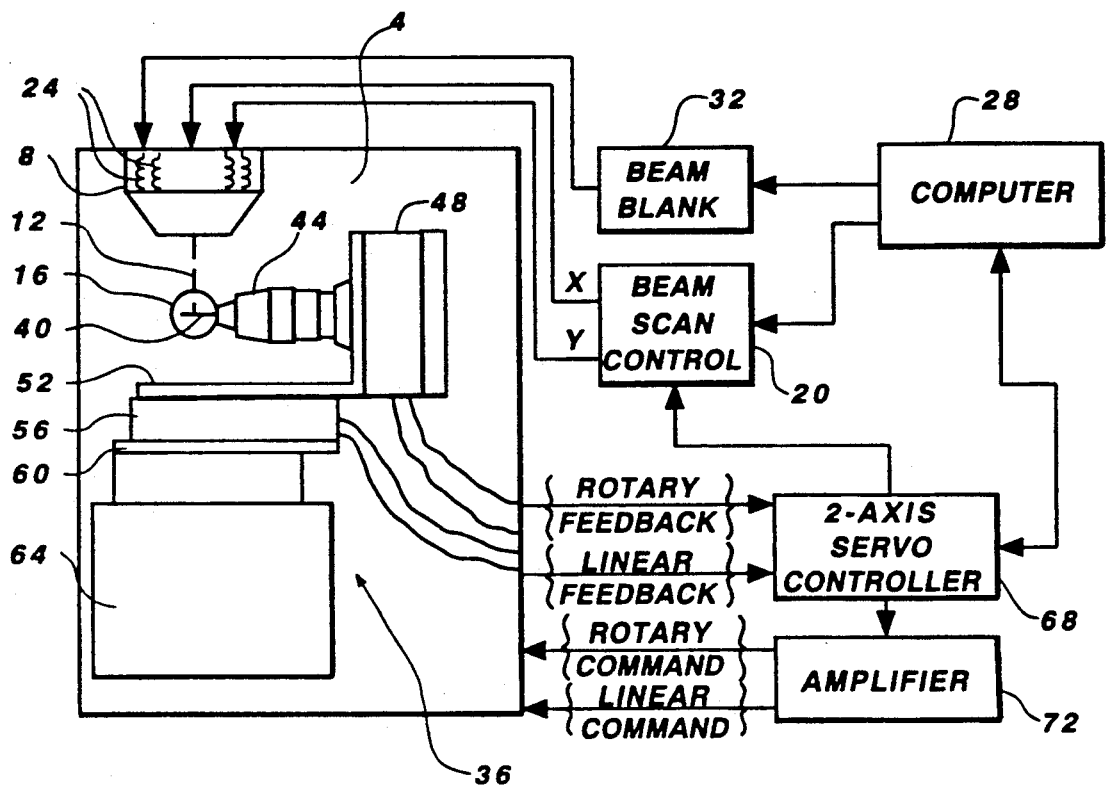
FIG. 1 is a schematic view of apparatus for the non-planar treatment of a workpiece using lithographic techniques, made in accordance with the principles of the present invention.

Referring to FIG. 1, there is shown an electron beam vacuum chamber 4 in which is disposed a conventional electron beam generator 8 of a scanning electron microscope. The electron beam generator 8 produces an electron beam 12 which is directed towards a work area 16. The direction of the electron beam 12 is under control of a beam scan control unit 20 and may be changed or caused to move along two orthogonal axes (designated the x and y axes) laterally of the beam. The beam scan control unit 20 applies analog signals to coils 24 in the electron beam generator 8 to control the direction of the electron beam 12, all in a conventional manner. The beam scan control unit 20 might illustratively be a digital-to-analog converter which receives digital signals from a computer 28 identifying the x and y coordinates which the electron beam 12 is to have. The computer 28, which controls the overall operation of the system of FIG. 1, could illustratively be a Compaq 386 computer.

A conventional beam blanking circuit 32 is provided to operate under control of the computer 28 to vary the intensity of electron beam 12. This intensity can be varied from zero (no beam) up to some predetermined upper limit intensity. Such operation is well known.

Also disposed in the vacuum chamber 4 is a workpiece positioning mechanism 36 for selectively moving and positioning a workpiece 40 which, in the embodiment shown in FIG. 1, is a small cylindrical bar or mandrel. The workpiece 40 is held by conventional chuck 44 which, in turn, is rotatably held by a rotary motorized stage 48. The rotary stage 48 is mounted on a bracket 52 which, in turn, is mounted on a linear motorized stage 56 which is moveable linearly on a track 60. The track 60 is mounted on a base 64 which may be manually moved and positioned in the chamber 4 as desired.

Both the rotary stage 4 and the linear stage 56 operate under control of the computer 28. The rotary stage 48 selectively causes rotation of the chuck 44 which, in turn, causes the workpiece 40 to rotate about an axis which is generally perpendicular to the electron beam 12, as shown. The linear stage 56, when it moves linearly on the track 60, carries with it the bracket 52, rotary stage 48, chuck 44 and thus the workpiece 40, in the direction of travel of the linear stage which is a direction parallel to the axis of rotation of the workpiece. In this manner, the workpiece 40 may be selectively moved under the electron beam 12 both rotationally and linearly to cause the electron beam to fall or impinge on different surface areas of the workpiece. In addition, the electron beam 12 can itself be caused to move orthogonally relative to the location of the workpiece under control of the beam scan control unit 20. The rotary motorized stage 48 might illustratively be a 360 degree continuous rotation stage, No. 345,341, manufactured by Klinger, and the linear motorized stage 56 might illustratively be a translational stage, No. MF04 also manufactured by Klinger.

Control of the operation of the rotary stage 48 and the linear stage 56 is effectuated by a two-axis servo controller 68 and an amplifier 72, again under control of the computer 28. The computer 28 supplies signals to the controller 68 in the form of commands for movement of the rotary stage 48 and linear stage 56. These signals are supplied to the amplifier 72 which then supplies rotary command signals to the rotary stage 48 and linear command signals to the linear stage 56 to cause the desired operation of the stages. As the rotary stage 48 and linear stage 56 are operated, both develop feedback signals representing the respective degrees of movement of the stages and these signals are supplied to the controller 68 which, in turn, supplies the signals to the computer 28. The computer 28 compares the feedback signals with the previously issued command signals to determine if the movement of the stages was in accordance with the command signals, and to make appropriate corrections if needed. The two-axis servo controller 68 might illustratively be a Galil DMC-620 controller and the amplifier 72 might illustratively be a Galil ICB-960 amplifier.

Figure 2:
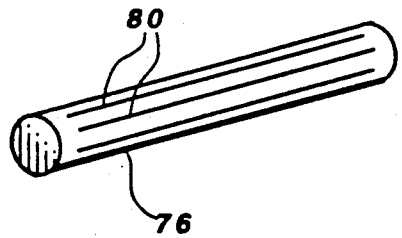
FIG. 2 is a perspective view of a cylindrical workpiece etched with a series of lines using the apparatus of FIG. 1.

FIG. 2 is a perspective view of a cylindrical bar or mandrel 76 in which parallel lines 80 have been etched in the mandrel using the apparatus of FIG. 1. These lines are etched using an electron beam lithographic process which includes applying an electron beam resist coating to the mandrel, etc. as will be described momentarily. The sequence of movement of the mandrel 76 by the chuck 44 would be to position one end of the mandrel in line with the electron beam 12, move the mandrel linearly a distance equal to the length of the line desired be formed in the mandrel, rotate the mandrel by an amount equal to the desired separation of the lines, move the mandrel linearly in the other direction under the electron beam, etc., until the mandrel has been exposed to the electron beam in the desired pattern of the lines.

Figure 3:
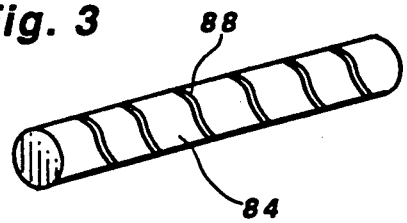
FIG. 3 is a perspective view of a cylinder workpiece etched with helical lines using the apparatus of FIG. 1.

FIG. 3 shows another bar or mandrel 84 in which a continuous helical line 88 has been formed thereon. In this case, the mandrel 84 would be moved by the chuck 44 linearly and rotationally at the same time so that the helical line 88 is exposed to the electron beam.

Although two degrees of freedom of movement of the workpiece 40 is possible with the apparatus of FIG. 1, clearly other degrees of freedom of movement could also be provided for the workpiece. For example, an additional linear degree of freedom of movement could be provided, the direction of which would be generally perpendicular to both the electron beam 12 and the direction of movement of the linear stage 56. This could be done by mounting the track 60 on another linear stage which would be moveable in a direction which was at right angles to the direction and movement of the stage 56. Also, the bracket 52 could be mounted on another rotational stage to allow rotation of the bracket and thus the workpiece 40 about an axis generally parallel to the electron beam 12 to thereby provide two rotational degrees of freedom of movement for the workpiece. In all, three rotational degrees of freedom of movement could be provided, along with three linear degrees of freedom of movement (although movement toward and away from the electron beam generator 8 in a linear fashion would probably not be too useful), or any combination thereof.

Although the apparatus of FIG. 1 utilizes an electron beam 12, it should be understood that the apparatus could be provided for directing a laser beam, ion beam, or an x-ray beam, toward a workpiece in the same manner as that described for the FIG. 1 apparatus.

An illustrative lithographic process for use with the apparatus of FIG. 1 could include first cleaning the workpiece using solvent such as acetone and two-propanol, or using a hydrogen peroxide cycle. The workpiece is then coated with an adhesion promoter such as HMDS which improves the ability of the electron beam resist to adhere to the workpiece. Electron beam resist would then be applied to the workpiece by simply dipping the workpiece in a solution of the resist. The electron beam resist is then set by soft-baking the workpiece in a convection oven, for example for about 30 minutes at about 80 degrees centigrade. The workpiece is then placed in the chuck 44 and then the electron beam generator 8 and mechanism 36 operated to expose the workpiece to the electron beam 12 to the desired pattern. After exposure is completed, the exposed electron beam resist is developed. During development of the exposed pattern, the resist overlying the pattern is washed away (positive lithography) or all other resist except that overlying the pattern is washed away (negative lithography). The workpiece is then baked in a convection oven, again for about 30 minutes at 80 degrees centigrade, for example. The workpiece is now ready for etching (or deposition) which is carried out by exposing the workpiece to an appropriate etching agent. In positive lithography, the pattern would be etched directly whereas in negative lithography, all except the pattern would be etched into the workpiece. Following the etching step, the remaining electron beam resist is removed and the workpiece is either ready for a next step in the fabrication process or is completed. (Deposition of a desired material on the workpiece, by sputtering, vapor deposition, etc., could be performed in place of etching.)

Exemplary materials for a workpiece using electron beam lithography include gold, silicon nitride, aluminum, steel and quartz. Appropriate etchants for the workpiece materials include phosphoric acid for aluminum, aqua regia for gold, ferric chloride or nitric acid for steel and nitric acid plus hydrofluoric acid for quartz.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. Apparatus for non-planar treatment of a workpiece comprising
   a chamber,
   means disposed in the chamber for producing and directing an exposure beam towards a work location,
   a chuck disposed in the chamber for holding and positioning the workpiece at the work location,
   first means disposed in the chamber and responsive to first control signals for selectively moving the chuck, and thus the workpiece, in a first degree of freedom of movement, to thereby expose different areas of the workpiece to the beam,
   second means disposed in the chamber and responsive to second control signals for selectively moving the chuck, and thus the workpiece, in a second degree of freedom of movement to thereby expose still other areas of the workpiece to the beam, and
   control means for developing and supplying first control signals to the first means, and second control signals to the second means.

2. Apparatus as in claim 1 further including means for selectively moving the beam laterally along orthogonal x and y axes in response to x-scan signals and y-scan signals respectively to cause the beam to impinge on different areas of the workpiece, and wherein said control means includes means for developing and supplying to said beam moving means x-scan signals and y-scan signals.

3. Apparatus as in claim 2 further including means responsive to intensity signals for selectively varying the intensity of the beam through a range of from zero intensity to a predetermined intensity, and wherein said control means includes means for developing and supplying to said varying means intensity signals.

4. Apparatus as in claim 1 wherein said first means comprises means for rotating said chuck, and thus the workpiece, about an axis generally perpendicular to the beam.

5. Apparatus as in claim 4 wherein said second means comprises means for moving said chuck, and thus the workpiece, linearly in direction generally parallel to said axis.

6. Apparatus as in claim 4 wherein said second means comprises means for rotating said chuck, and thus the workpiece, about an axis generally orthogonal to the first-mentioned axis and generally parallel to the beam.

7. Apparatus as in claim 1 wherein said first means comprises means for moving said chuck, and thus the workpiece, linearly in a direction generally perpendicular to the beam.

8. Apparatus as in claim 7 wherein said second means comprises means for moving said chuck, and thus the workpiece, linearly in a direction generally perpendicular to the beam and generally perpendicular to the direction of movement of the first means.

9. Apparatus as in claim 1 wherein said beam producing means comprises means for producing an electron beam, and wherein said chamber is a vacuum chamber.

10. Apparatus as in claim 1 wherein said beam producing means comprises means for producing an ion beam, and wherein said chamber comprises a vacuum chamber.

11. Apparatus as in claim 1 wherein said beam producing means comprises means for producing a laser beam.

12. Apparatus as in claim 1 wherein said beam producing means comprises means for producing an x-ray beam.

13. A method of etching/depositing a pattern in a workpiece comprising the steps of:
    (a) applying an electron beam resist to the workpiece,
    (b) setting the resist by applying heat thereto,
    (c) directing an electron beam toward the workpiece,
    (d) moving the workpiece in at least two degrees of freedom of movement relative to the electron beam to expose said pattern in the resist to the electron beam,
    (e) developing the exposed resist on the workpiece,
    (f) etching/depositing the pattern on the workpiece over which the exposed resist was located, and
    (g) removing the remaining resist from the workpiece.

14. A method as in claim 13 wherein step (f) comprises applying an etching agent to the workpiece.

15. A method as in claim 13 wherein step (f) comprises depositing a material on the workpiece.

16. A method as in claim 14 wherein said workpiece is material selected from the group consisting of aluminum, gold, silicon nitride, steel and quartz.

17. A method of etching/depositing material on a workpiece to form a desired pattern comprising the steps of:
    (a) applying a resist to the workpiece,
    (b) setting the resist,
    (c) directing an exposure beam toward the workpiece,
    (d) moving the workpiece in at least two degrees of freedom of movement relative to the beam to expose said pattern in the resist to the beam,
    (e) developing the exposed resist on the workpiece, and
    (f) etching/depositing material on the workpiece in a manner determined by said pattern.

18. A method as in claim 17 wherein step (d) comprises the steps of rotating the workpiece about an axis generally perpendicular to the beam, and moving the workpiece linearly in a direction parallel to the axis.

19. A method as in claim 17 wherein the exposure beam is an electron beam.

20. A method as in claim 17 wherein the exposure beam is an ion beam.

21. A method as in claim 17 wherein the exposure beam is a laser beam.

22. A method as in claim 17 wherein the exposure beam is an x-ray beam.

* * * * *